United States Patent
Wambsganss

(10) Patent No.: US 11,387,039 B2
(45) Date of Patent: Jul. 12, 2022

(54) INTEGRATED TRANSFORMER WITH LOW AC LOSSES AND IMPEDANCE BALANCED INTERFACE

(71) Applicant: Astronics Advanced Electronic Systems Corp., Kirkland, WA (US)

(72) Inventor: Warren J. Wambsganss, Snoqualmie, WA (US)

(73) Assignee: Astronics Advanced Electronic Systems Corp., Kirkland, WA (US)

(*) Notice: Subject to any disclaimer, the term of this patent is extended or adjusted under 35 U.S.C. 154(b) by 331 days.

(21) Appl. No.: 16/790,439

(22) Filed: Feb. 13, 2020

(65) Prior Publication Data

US 2020/0258680 A1 Aug. 13, 2020

Related U.S. Application Data

(60) Provisional application No. 62/805,289, filed on Feb. 13, 2019.

(51) Int. Cl.

| | | |
|---|---|---|
| H01F 27/38 | (2006.01) | |
| H01F 27/24 | (2006.01) | |
| H01F 27/42 | (2006.01) | |
| H01F 27/06 | (2006.01) | |
| H01F 27/28 | (2006.01) | |

(Continued)

(52) U.S. Cl.
CPC ............... *H01F 27/38* (2013.01); *H01F 3/14* (2013.01); *H01F 27/06* (2013.01); *H01F 27/24* (2013.01); *H01F 27/2804* (2013.01); *H01F 27/425* (2013.01); *H01F 30/06* (2013.01); *H05K 1/165* (2013.01); *H05K 1/181* (2013.01); *H01F 2027/065* (2013.01); *H05K 2201/1003* (2013.01)

(58) Field of Classification Search
CPC ........ H05K 1/182; H05K 1/165; H01F 27/38; H01F 27/06; H01F 27/24; H01F 27/2804; H01F 27/425; H01F 2027/065
USPC ........................................................ 361/760
See application file for complete search history.

(56) References Cited

U.S. PATENT DOCUMENTS

| | | |
|---|---|---|
| 4,613,841 A | 9/1986 | Roberts |
| 4,803,609 A | 2/1989 | Gillett et al. |

(Continued)

FOREIGN PATENT DOCUMENTS

CN 104078194 B 10/2017

OTHER PUBLICATIONS

PCT International Search Report and Written Opinion of the ISA, dated Apr. 27, 2020, for PCT/US2020/018144.

*Primary Examiner* — Sherman Ng
(74) *Attorney, Agent, or Firm* — Wiggin and Dana LLP; Pierre R. Yanney; Thomas M. Landman

(57) ABSTRACT

An integrated transformer device is provided with both inductive and transformer elements. The inductive and transformer elements are combined within the same device, sharing at least a part of the same magnetic and electrical paths. The integrated transformer device comprises a top core, a bottom core, and a shunt core. A high voltage winding is wound around the bottom core. A low voltage winding is wound around the bottom core and the shunt core. Power semiconductor devices, connected in parallel, form a portion of the low voltage winding and are disposed at a location proximate to the high voltage winding.

18 Claims, 12 Drawing Sheets

(51) Int. Cl.
    *H01F 30/06*     (2006.01)
    *H05K 1/16*     (2006.01)
    *H05K 1/18*     (2006.01)
    *H01F 3/14*     (2006.01)

(56) References Cited

U.S. PATENT DOCUMENTS

| | | |
|---|---|---|
| 4,864,486 A | 9/1989 | Spreen |
| 5,225,971 A | 7/1993 | Spreen |
| 5,783,984 A | 7/1998 | Keuneke |
| 6,320,490 B1 | 11/2001 | Clayton |
| 6,362,715 B1 * | 3/2002 | Chiang ............... H01F 27/2804 336/200 |
| 6,714,428 B2 | 3/2004 | Huang et al. |
| 6,927,661 B2 | 8/2005 | He et al. |
| 7,123,123 B2 | 10/2006 | Isurin et al. |
| 7,289,329 B2 | 10/2007 | Chen et al. |
| 7,889,043 B2 | 2/2011 | Hsu et al. |
| 9,396,865 B1 * | 7/2016 | Folker ....................... H01F 5/04 |
| 2002/0167385 A1 | 11/2002 | Ackermann |
| 2007/0096278 A1 * | 5/2007 | Nakatsu ................ H01L 25/072 257/E23.098 |
| 2008/0024261 A1 * | 1/2008 | Shinmen ............... H01F 27/327 336/208 |
| 2009/0309684 A1 | 12/2009 | Tsai et al. |
| 2012/0038447 A1 * | 2/2012 | Tao ....................... H01F 27/326 336/192 |
| 2015/0332844 A1 | 11/2015 | Xiong et al. |

\* cited by examiner

INTEGRATED TRANSFORMER WITH LOW AC LOSSES AND IMPEDANCE BALANCED INTERFACE

CROSS REFERENCE TO RELATED APPLICATION

The present non-provisional application claims priority to provisional application Ser. No. 62/805,289 filed Feb. 13, 2019, also entitled "Integrated Transformer with Low AC Losses and Impedance Balanced Interface," the disclosure of which is incorporated herein by reference.

FIELD OF THE DISCLOSURE

The present disclosure generally relates to a transformer, and more particularly, to an integrated transformer with low alternating current (AC) power loss.

BACKGROUND OF THE DISCLOSURE

Converters are devices that convert electrical energy from one form to another and are typically used to convert one voltage to another voltage. Resonant converters and resonant transition converters rely on either a series inductive component or a transformer-integrated inductor to provide inductance, which together with and added capacitance, creates a resonant tank. These resonant and resonant transition converters utilize the resonant tank and soft switching techniques to achieve low loss and high efficiency conversion.

In instances of isolated converter topologies, a transformer is often required for providing isolation, as well as voltage increase or voltage reduction using the turns ratio. Since both inductive and transformer elements are needed in such converters, it would be desirable to combine features of both into the same component.

Previous transformer systems, such as the one described in U.S. Pat. No. 7,123,123, titled "High-frequency Power Transformer" by Alexander Isurin et al., disclose a transformer with low AC conduction losses. The low loss results from the proximity between the primary and secondary windings. Yet, this system does not provide for the equal distribution of current among parallel-connected power semiconductor devices, such as field-effect transistors (FETs), diodes, or insulated-gate bipolar transistors (IGBTs), in the high current path with a balanced impedance interconnect to the high current winding. An equal distribution of current is desirable to lower power dissipation and component stress, and to enhance overall reliability of the power converter. Further, the configuration of these power semiconductor devices, such as metal-oxide-semiconductor field-effect transistors (MOSFETS), diodes, or IGBTS, as disclosed, fails to complete a winding turn, and therefore results in increased loss. Moreover, an additional deficiency of such transformers is the inability to achieve sufficiently high leakage inductance, suitably high for a resonant converter to operate over a wide input voltage range, without inserting a large gap between the primary and secondary windings. However large gaps between the primary and secondary windings are undesirable, as they result in substantially elevated AC losses in the windings.

U.S. Patent Application No. 2002/0167385, titled "Transformer with Integrated Inductor" by Bernd Ackermann, discusses integrating an inductive element into a transformer. Yet, this results in very high AC conduction losses, since the first and secondary windings are not overlapping.

Additional instances of higher losses can be found in U.S. Pat. No. 6,927,661, titled "Planar Transformer and Output Inductor Structure with Single Planar Winding Board and Two Magnetic Cores" by Jin He et al., which integrates an inductor and transformer, but maintains separate cores. The separation of cores results in non-shared flux or conduction paths, contributing to the higher losses.

Even in instances where the inductive element and the transformer are integrated into the same core, as shown in U.S. Pat. No. 6,714,428, titled "Combined Transformer-inductor Device for Application to DC-to-DC Converter with Synchronous Rectifier" by Guisong Huang et al., the electrical separation of the inductive element and the transformer still fails to yield a useful resonant converter. Indeed, even when the same core is utilized for the inductive element and the transformer, separation of the primary and secondary windings causes elevated AC conduction loss, as shown in U.S. Pat. No. 5,783,984, titled "Method and Means for Combining a Transformer and Inductor on a Single Core Structure" by Carl Keuneke. U.S. Pat. No. 4,613,841, titled "Integrated Transformer and Inductor" by Victor Roberts, showcases the problem of separating the primary and secondary windings by even a portion of the core, within the same core, resulting in elevated AC losses. Further, the separation in this instance prevents the provision of a balanced impedance interconnect between a high current winding and parallel-connected power semiconductor devices.

It would be desirable, therefore, to provide a transformer that integrates inductive and transformer elements into a single device. It would be further desirable to provide a transformer with low AC conduction losses. To reduce conduction losses even more, it would be yet further desirable to provide a transformer with a balanced impedance interconnect between a high current winding and power semiconductor devices.

A system is hereby provided that includes a device with both inductive and transformer elements. The system may further provide a device with the inductive and transformer elements sharing at least a portion of both the magnetic and electrical paths.

The system may further provide for reduced space and weight, and may reduce conduction and core losses. In accordance with an embodiment, the system may minimize or eliminate significant AC conduction losses, and provide a balanced impedance connection with power semiconductor devices.

SUMMARY OF THE INVENTION

In accordance with an embodiment, disclosed is a device with both inductive and transformer elements. The inductive and transformer elements are combined within the same device, sharing at least a part of the same magnetic and electrical paths. In accordance with an embodiment, conduction loss and core loss are reduced, and a well-defined path for leakage flux in an integrated transformer is provided.

As disclosed herein, the device, in accordance with an embodiment, provides a balanced impedance connection with power semiconductor devices, such as FETs, diodes, or IGBTs, connected in parallel, utilizing high current. In a further embodiment power semiconductor devices may complete a turn or plurality of turns of the transformer winding. Such low impedance interconnects further reduce conduction losses in the transformer via the reduction of AC losses. This additionally provides the benefit of preventing current crowding in terminals. An integrated transformer and inductor apparatus with balanced impedance connection with parallel-connected power semiconductor devices in a high current winding is therefore provided for use in high-frequency resonant mode switching power converters.

BRIEF DESCRIPTION OF THE DRAWINGS

The foregoing aspects, and other advantages and benefits of the embodiments and circuit arrangements disclosed herein will become apparent from the following more detailed description, which may be understood with reference to the attached drawings, in which like designations refer to like elements, and wherein:

FIG. 1A is a bottom perspective view and FIG. 1B is a top perspective view of the integrated transformer.

DETAILED DESCRIPTION OF THE INVENTION

Figure 1A:
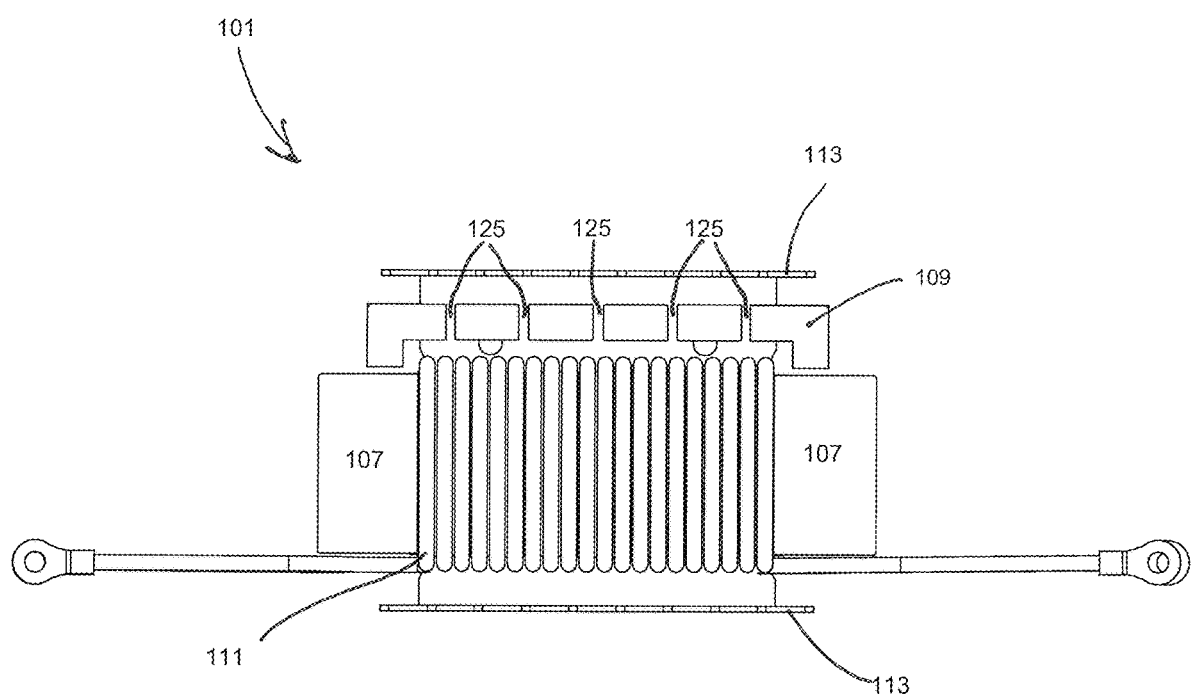
FIGS. 1A and 1B illustrate an integrated transformer in accordance with an embodiment.
Figure 1B:
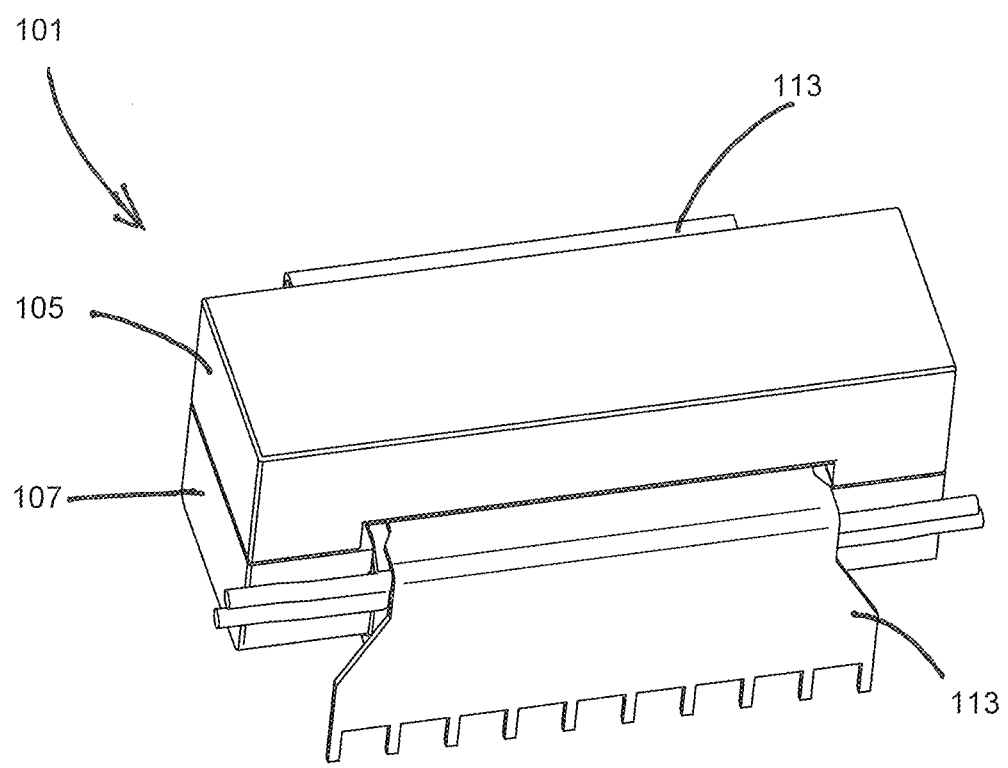

An exemplary embodiment is described herein with reference to the system depicted in FIGS. 1A and 1B. The transformer 101 includes a core formed of three sections: top core 105, bottom core 107 and shunt core 109, with shunt core 109 containing an array of distributed gaps 125.

In an embodiment, transformer 101 may be a 7 kW rated transformer. However, it should be noted that transformer 101 may be rated for any other suitable high-current or high-power transformers. For example, high current may be in the tens of amperes to thousands of amperes, or any other suitable amount. In a further example, high power may be in the hundreds of watts to hundreds of thousands of watts.

In accordance with an embodiment, shunt core 109 may be formed of a low-permeability magnetic material, such as powdered metal. However, the shunt core 109 may also be formed as a segmented core of a higher-permeability material like ferrite. The choice of shunt core material will depend on various factors including the switching frequency, maximum flux density, and core size. The shunt core 109 may be formed of any suitable material, such as additional types of low-permeability magnetic material, or additional forms of higher-permeability material. For example, in certain embodiments, the shunt core 109 may be formed of Sendust or powdered iron.

In the embodiment of FIGS. 1A and 1B, a top core 105 is disposed above a bottom core 107. The top 105 core may physically engage or mate with the bottom core 107 to retain the relative positioning of both cores. A shunt core 109 is disposed adjacent to the bottom core 107 and may physically engage or mate with the bottom core 107 to retain the relative positioning of both cores. In the embodiment, a holder (shown as holder 215 in FIG. 2) and an adhesive (not shown) are used to maintain the relative positioning of the cores 105, 107 and 109.

Integrated transformer 101 further includes a high voltage winding 111. The high voltage winding 111 may be formed with multiple turns, such as nine turns, for example. The optimal number of turns will depend on the design goals for a particular intended use, of course. The wire gauge used for winding 111 will depend on the power level of the transformer and may, for example, consist of a single 16-gauge wire or multiple heavier gauge wires in parallel. That is, the high voltage winding 111 may be configured as multiple turns to conduct lower current, but with a higher applied voltage. For example, the high voltage winding 111 may be connected to power semiconductor devices, but because the current in that winding may be lower, AC losses may not be significant and thus not necessitate a balanced impedance connection to those multiple power semiconductor devices. The voltage level of the high voltage winding 111 is not constrained to any particular value and may range from about 50 to 100,000 volts, for example. In some embodiments, however, a suitable high voltage level may be in the range of about 200 to 800 volts.

Integrated transformer 101 further includes a low voltage winding 113. The low voltage winding 113 may be a single turn and conduct high current but with a lower applied voltage. In the embodiment shown in FIGS. 1A and 1B, the low voltage winding 113 is formed from a flat piece of metal that has been preformed into the necessary shape. Because of the high currents conducted therethrough, the low voltage winding 113 includes a balanced impedance interconnect for connection to an arrangement of multiple power semiconductor devices connected in parallel as described below in reference to FIG. 8

In this embodiment, the high voltage winding 111, interposed between the top core 105 and the bottom core 107 and between the bottom core 107 and the shunt core 109, is wound around the bottom core 107. The low voltage winding 113, interposed between the top core 105 and the bottom core 107, is wound around the bottom core 107, the high voltage winding 111, and the shunt core 109.

As shown, the windings 111 and 113 are located in close proximity to one another for most of the winding length. For example, the high voltage winding 111 and the low voltage winding 113 may be spaced apart at a distance of 0 to 0.25 times the width of the high voltage winding 111. In this embodiment, the width of the high voltage winding 111 is approximately 2.5 inches. The windings 111 and 113 may be insulated so as to be electrically isolated from each other even when touching. It is preferable for the windings 111 and 113 to be situated as close together as possible, within mechanical tolerances, in order to provide for a more uniform distribution of current density over the surface of the windings 111 and 113 due to the proximity effect. In contrast, if the windings 111 and 113 were not in close proximity to each other, in other words, if the windings 111 and 113 were separated by more than about 0.25 times the width of the high voltage winding 111, most of the current would crowd to the edges of the low voltage winding, greatly increasing the AC losses. Here, however, due to the proximity effect, current does not concentrate at the edges of the low voltage winding and therefore AC loss is minimized.

Figure 2:
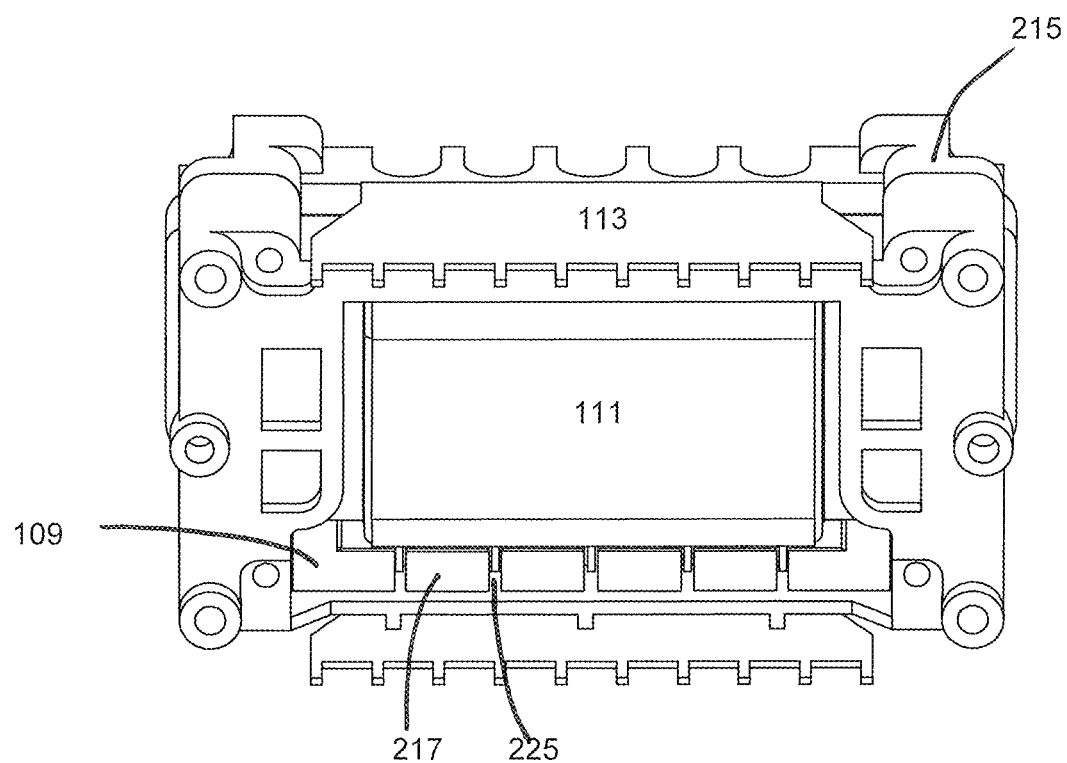
FIG. 2 illustrates an exemplary embodiment of the integrated transformer with a transformer holder.

FIG. 2 illustrates a holding device for transformer 101. As shown, the holder 215 maintains the placement of windings 111 and 113, as well as the top core 105, the bottom core 107, and the shunt core 109. Thus, holder 215 keeps all components in place and positions them correctly. The holder may be formed from a non-magnetic, non-conductive material such as injection molded plastic, for example.

In this embodiment, shunt core 109 is formed of several segments 217 that are correctly spaced apart from one another and from the bottom core 107 by the transformer holder 215. The spacing (gap) 225 between individual shunt segments is controlled by the transformer holder 215 to be between 0% and 25% of the length of shunt segments 217. The desired gap distance depends on the design goals and can be calculated directly based on various parameters such the required power capacity, acceptable amount of loss, core flux density, and the amount of leakage inductance necessary for the transformer. The array of small gaps 225 (otherwise referred to as a distributed gap 225) provides a large total gap distance, but contains the magnetic flux. Thus, in comparison to a single large gap, a distributed gap in the shunt core provides for more efficient performance since the magnetic flux from a distributed gap does not significantly fringe into the transformer windings, which would cause elevated conduction losses in those windings. The number of shunt segments 217 will vary depending on the desired gap distance and may range from one to seven segments 217 in some embodiments.

It should be noted that, in some embodiments in accordance with the invention, the shunt core 109 may be configured as a solid, self-supporting core instead of multiple shunt core segments 217, such as those shown in FIG. 2.

Figure 3:
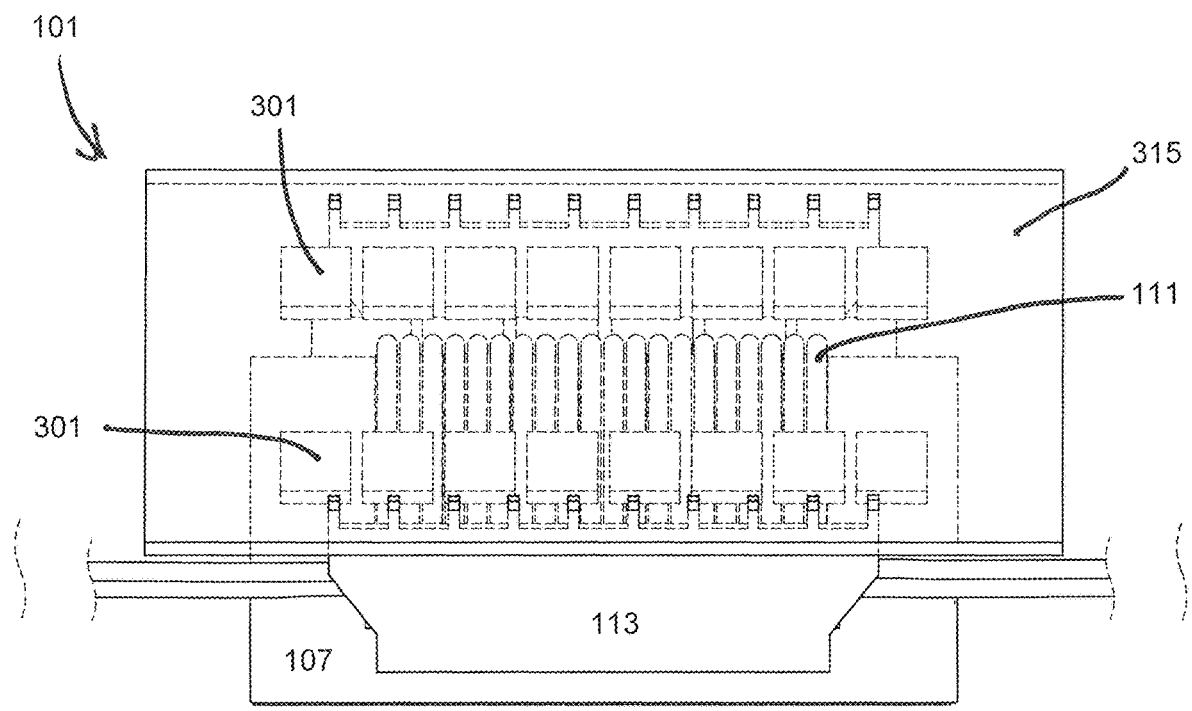
FIG. 3 illustrates an exemplary embodiment of the transformer device with power semiconductor devices.

Referring now to FIG. 3, illustrated is the transformer 101 integrated with parallel-connected power semiconductor devices 301. In FIG. 3, the power semiconductor devices 301 are mounted on a printed wiring board or direct bonded copper (DBC) substrate 315 on the substrate side that faces the transformer cores 105, 107, and 109. FIG. 3 shows the close interconnection between the low voltage winding 113 and the power semiconductor devices 301. The power semiconductor devices 301 in the position shown complete the winding turn, thereby minimizing significantly the distance that the high currents of winding 113 are required to travel. Thus, since the power semiconductor devices themselves are physically part of the winding length, the distance that the current would otherwise need to travel through an electrical conductor is significantly reduced. In high current converters, the distance high AC current must travel in a conductor is directly related to losses, and therefore, reducing the distance current must travel significantly reduces losses.

Moreover, in this embodiment, the high voltage winding 111 is positioned sufficiently close to the parallel-connected power semiconductor devices 301 such that proximity effects from the high voltage winding 111 cause current to be evenly distributed among the paralleled power semiconductor devices 301, which are part of the physical transformer winding 113. The even distribution of current results in greater reliability and lower overall power dissipation.

Further, the larger physical size of a power device, namely, the power semiconductor devices 301, significantly reduces the electrical length of the low voltage transformer winding 113, when inserted as part of the winding. Utilizing a larger power semiconductor device 301 would therefore further serve to reduce conduction loss in the transformer.

Figure 4:
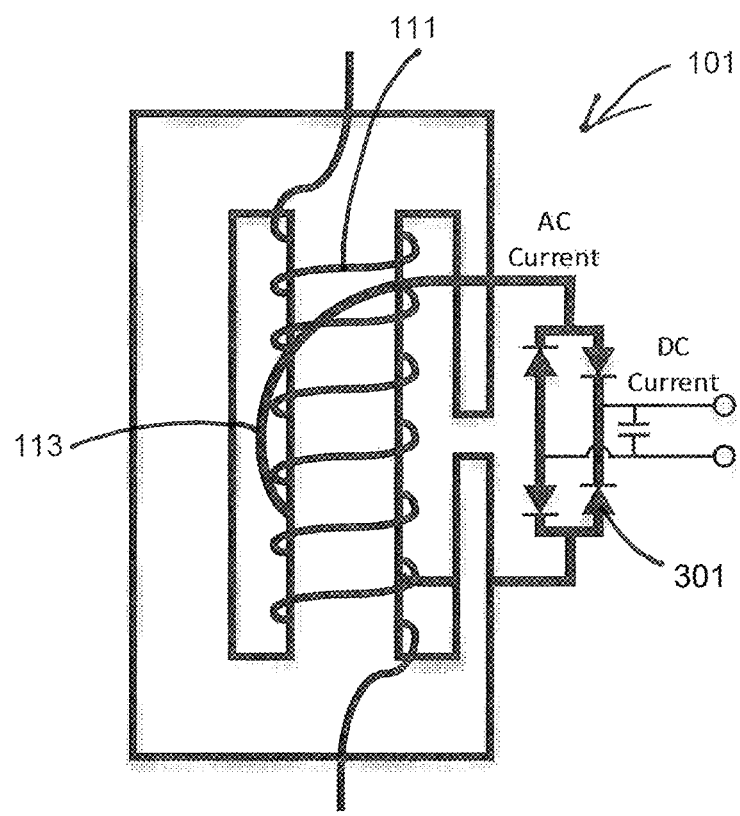
FIG. 4 illustrates an exemplary embodiment of an electrical and magnetic interconnection of a transformer.

Referring now to FIG. 4, illustrated is a view of an electrical and magnetic interconnection of the transformer 101 and rectifiers (power semiconductor devices) 301, depicting the AC and DC electrical paths.

Figure 5:
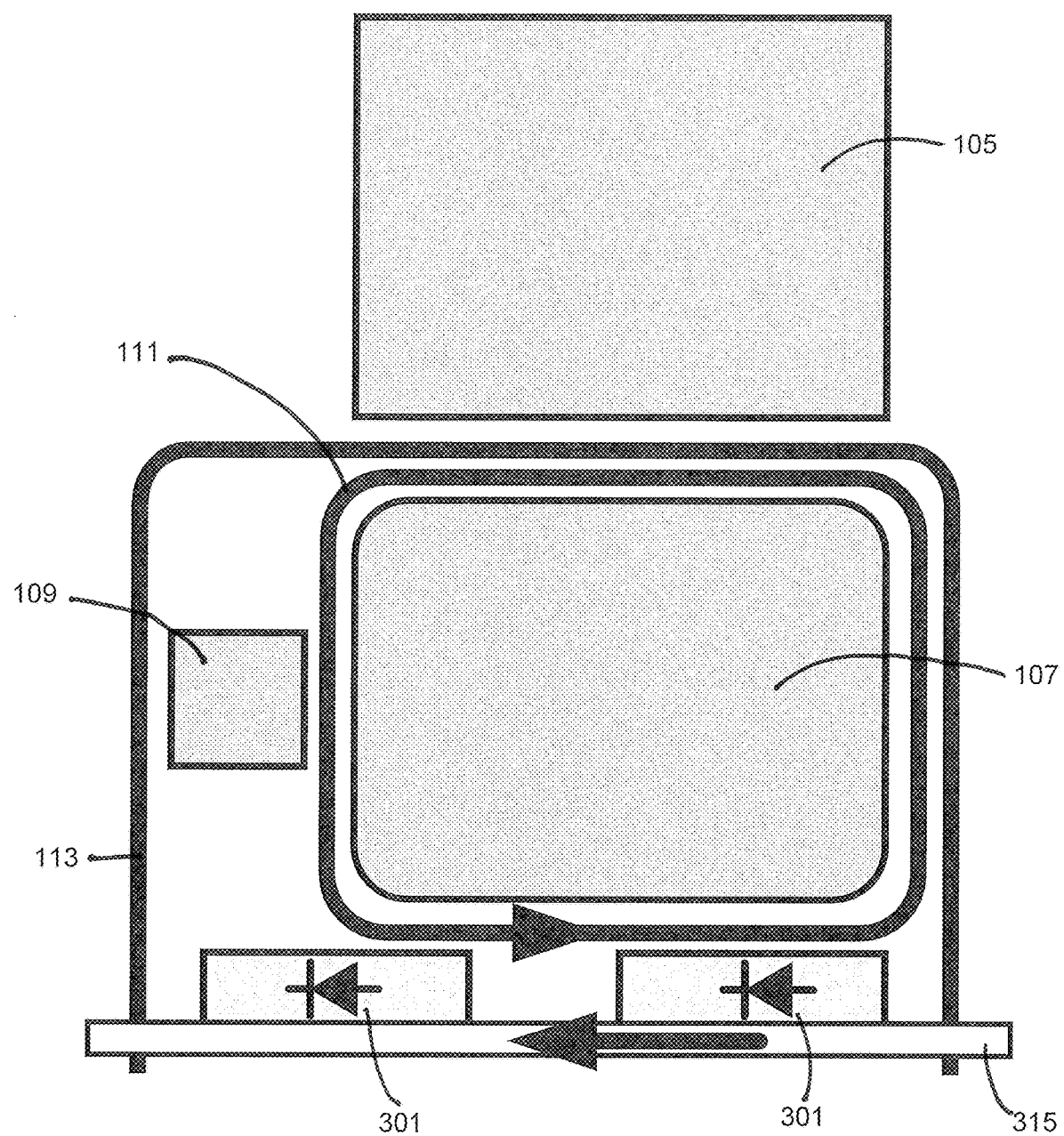
FIG. 5 illustrates a cross-section of a transformer, in accordance with an embodiment.

FIG. 5 illustrates the physical interconnect between the rectifiers 301 and the transformer winding 113, and the printed wire circuit board 315. In accordance with various embodiments, either of FETs, diodes, or IGBTs 301, collectively referred to as power semiconductor devices, may be used for rectification of the AC current to DC current or for conversion of AC current from DC current. This allows for the low voltage winding 113 to be either a power input or a power output. Although not shown in FIG. 5, power semiconductors may also be connected to the high voltage winding 111, and the transformer 101 may be used for either unidirectional or bidirectional power conversion.

Figure 6:
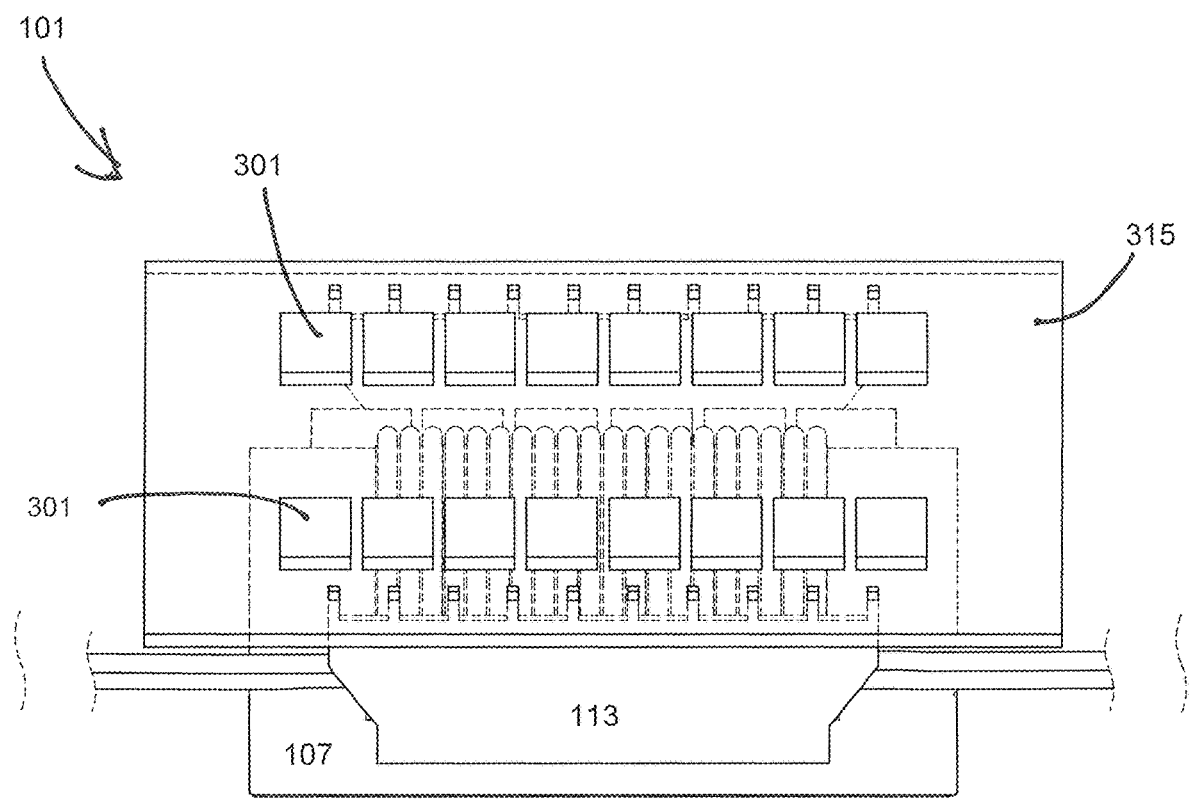
FIG. 6 illustrates another embodiment of the transformer, with an alternative position for the FETs or diodes.

FIG. 6 illustrates another embodiment, with an alternative position for the power semiconductor devices 301 connected to the transformer 101, in contrast to FIG. 3. In this embodiment, the power semiconductor devices 301 are mounted on an opposite side of the circuit board or substrate 315 relative to the transformer cores 105, 107 and 109. This embodiment maintains the benefit of the power semiconductor devices forming a portion of the low voltage winding and providing a balanced impedance connection to the transformer, while facilitating the power semiconductor devices to be in direct contact with a heatsink (not shown). Thus, with the power semiconductor devices in direct contact with the heatsink, the circuit board is no longer part of the thermal path, which improves thermal performance. In this embodiment, the power semiconductor devices may also be removed without requiring removal of the transformer, facilitating ease of rework.

Thus, the transformer 101 provides for integration of an inductor and transformer within the same component. As shown, portions of both of the magnetic flux path and electrical conduction path are shared between the inductor element and transformer element, thereby providing a reduction in conduction and core losses. Moreover, the use of a single integrated part results in smaller size and lower weight compared to the use of a separate transformer and inductor.

The location of the high voltage winding 111 proximal to the low voltage winding 113 results in a reduction in AC loss. The electrical paths of these two windings diverge only over a small portion of their total path length, between 5% and 30% of the winding length, which does not significantly increase loss.

The shunt core 109 provides a well-defined leakage flux path that does not significantly increase AC loss, and the leakage inductance can be accurately and widely tuned by changing the distributed gap in the shunt core. A reduction in distributed gap distance in the shunt core will therefore increase the leakage inductance, and an increase in distributed gap distance in the shunt core will therefore decrease the leakage inductance. The leakage inductance created by shunt core 109, together with the addition of a capacitance, may be used to create a resonant tank and such a resonant tank may be utilized in a resonant DC/DC converter.

The parallel power semiconductor devices 301, in their connection to low voltage winding 113, are connected to the transformer in a balanced impedance connection. The connecting impedance is determined by the length of the electrical path connecting the power semiconductor devices 301 to the low voltage winding 113. In this balanced impedance connection, the power semiconductor devices 301 are arranged so that each device 301 has the same electrical path length to the low voltage winding 113, thus balancing the impedance connection. Here, the low voltage winding 113 connects to the circuit board 315 by elongated terminals 823 and the power semiconductor devices 301 connect to the terminals 823 (shown in FIG. 8). Terminals 823 have a greater length dimension than width dimension by a ratio of at least 10 to 1. The terminals 823 may be formed into an array of pins that facilitate soldering to the printed wiring board. In one embodiment, the power semiconductor devices 301 may be arranged into two rows between the transformer terminals 823, spaced apart at approximately equal intervals within each row, and connected in parallel to the terminals 823. The equidistance spacing of the power semiconductor devices 301 is important for achieving optimal current balance. The length of the power semiconductor device rows is between 75% and 125% of the width of the low voltage winding 113. This physical arrangement of the parallel power semiconductor devices 301 and their connection to the low voltage winding 113 via the transformer terminals 823 form a balanced impedance connection between the power semiconductor devices and the low voltage winding. As a result of this physical arrangement of components, the electrical path length for the high current conducted in the low voltage winding is minimized, thereby minimizing conduction loss. Moreover, the power semiconductor devices 301 form a part of the low voltage winding itself thereby further minimizing conduction loss. Additionally, the proximity effect from the current in the high voltage winding 111 causes the current to be evenly distributed among the paralleled power semiconductor devices 301, thereby minimizing conduction loss in the power semiconductor devices 301.

As disclosed, the interconnect impedance between the transformer connections and the power semiconductor devices 301 connected in parallel is balanced. In other words, the impedance between the transformer and each power semiconductor device is equal. This equal interconnect impedance provides for a balanced current flow between the power semiconductor devices, when connected in parallel to the winding 113. Accordingly, the transformer is specifically provided with multiple power semiconductor devices, connected in parallel, to realize the requisite current carrying capability for the transformer. Parallel balanced connections are critical since, in instances where the AC impedance between multiple parallel interconnected devices is not balanced, the current would not be evenly distributed among those devices. An imbalanced interconnect impedance between the parallel multiple power semiconductor devices 301 would result in unequal currents, which in turn would lead to increased power dissipation and, due to the associated elevated levels of component stress, a reduction in reliability of the power converter.

Figure 7:
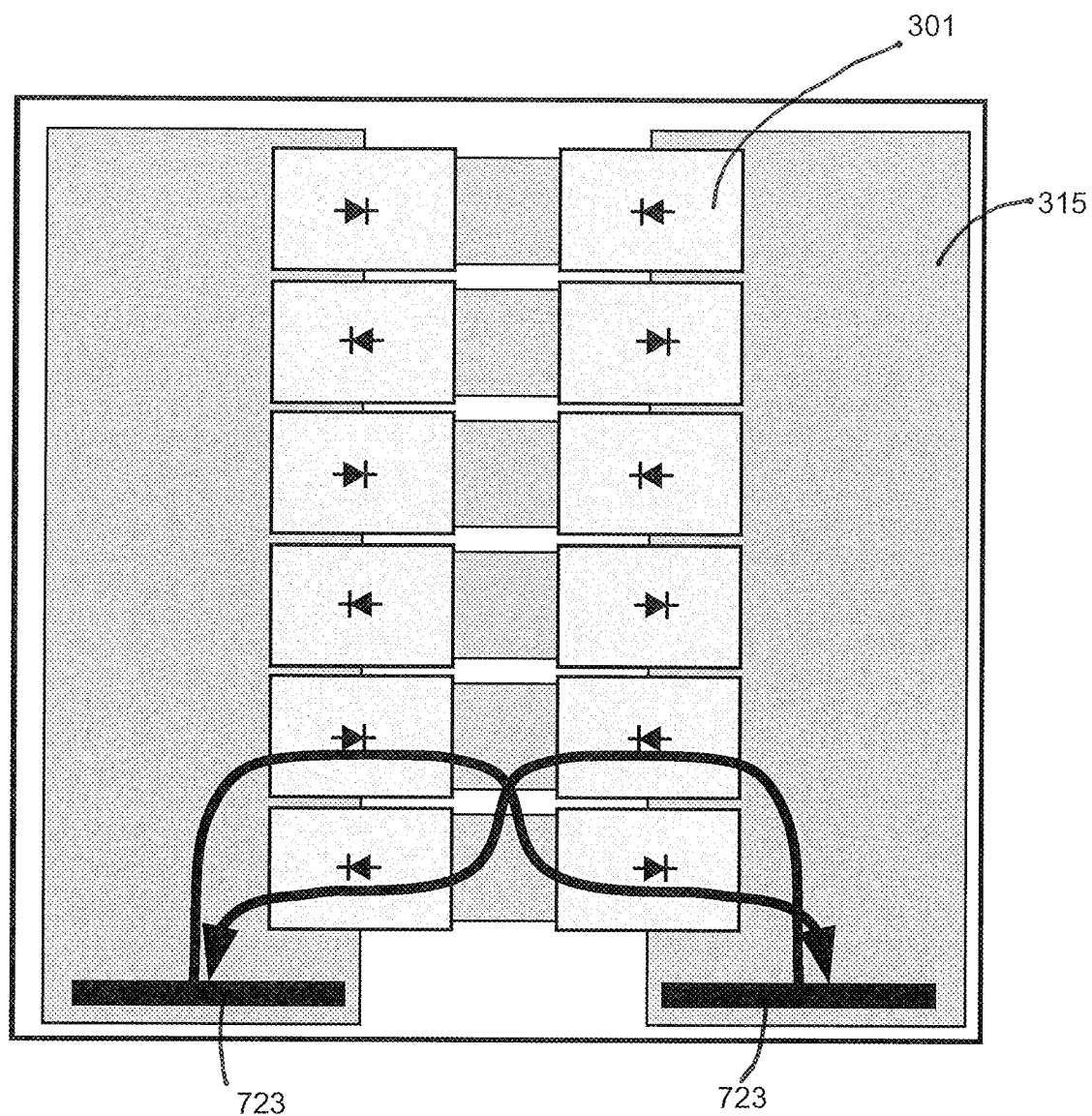
FIG. 7 illustrates a prior art view of poorly arranged parallel rectifiers.

Referring now to FIG. 7, shown is an example of poorly arranged rectifiers, connected in parallel in a full-bridge configuration. This configuration, currently known in the art, causes AC currents to flow primarily in the power devices closest to the transformer terminals 723. Thus, as shown in FIG. 7, existing systems cause AC currents to flow, as shown in the arrowed lines, toward the transformer terminals 723 because the power semiconductor devices located closest to the transformer terminals 723 have the lowest interconnect impedance. This causes the other power semiconductor devices farther away from the transformer terminals 723 to conduct very little current.

Figure 8:
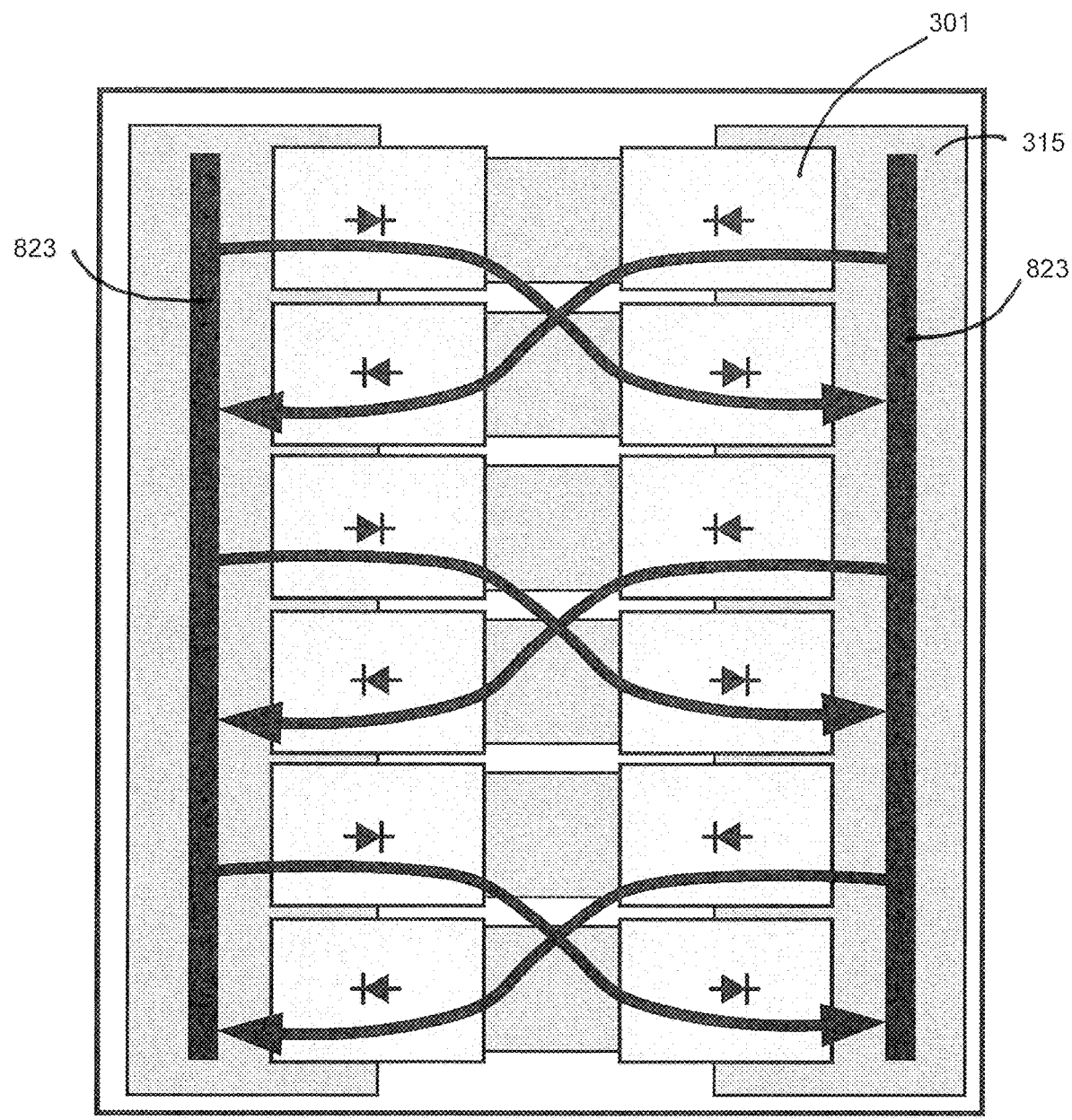
FIG. 8 illustrates an embodiment of the invention, with parallel-connected power semiconductor devices and balanced interconnect impedance.

Shown in FIG. 8, an embodiment of the present invention addresses the problem of FIG. 7 by providing the power semiconductor devices with balanced impedance interconnects. Transformer terminals 823 are shown in a parallel layout, closer to each power semiconductor device pairing. This layout provides for nearly equal current distribution between the devices connected in parallel. As a result, the interconnect impedance between the devices connected in parallel is balanced, resulting in evenly distributed current through each device.

As discussed, conduction loss is minimized in the power semiconductor devices due to the proximity effects from the current in the high voltage winding. This proximity effect evenly distributes current among the paralleled power semiconductor devices, thereby minimizing the conduction loss.

In some scenarios, however, an unequal sharing of current may result from slight differences in the voltage drop between devices connected in parallel or from high-frequency AC effects that may cause current to be pushed to power devices on the outer edges.

Figure 9:
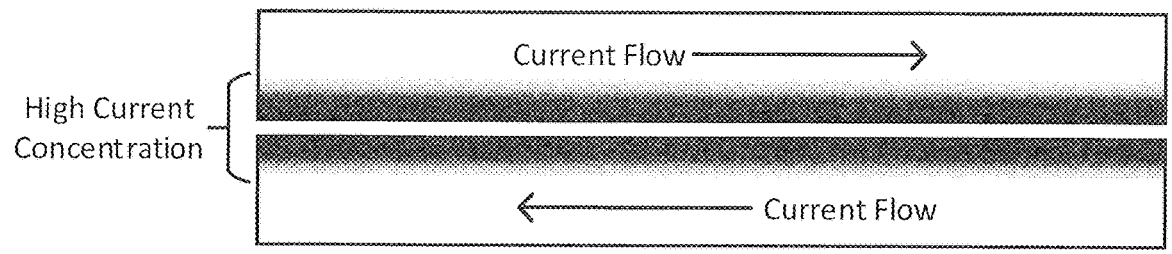
FIG. 9 illustrates a prior art view of the proximity effect.

FIG. 9 illustrates this problem and shows the proximity effect caused by AC current flowing through adjacent conductors, where the AC current in each conductor flows in opposite directions. Since the current flows in opposite directions, the current tends to concentrate along the edges of the conductors closest to one another.

In accordance with an embodiment of the present invention, this problem is solved by using the proximity effect to create even current flow between power devices interconnected in parallel. The proximity effect causes the AC current to be evenly distributed over the faces of the conductors in closest proximity to the high voltage winding, regardless of whether the said conductors are the low voltage winding 113 or the power semiconductor devices 301. The width of the high voltage winding 111 may be between 75% and 125% of the width of the low voltage winding 113. An approximately equivalent width between the high voltage winding and low voltage winding results in an even distribution of current over the surface of the low voltage winding and a reduction in conduction loss.

Figure 10:
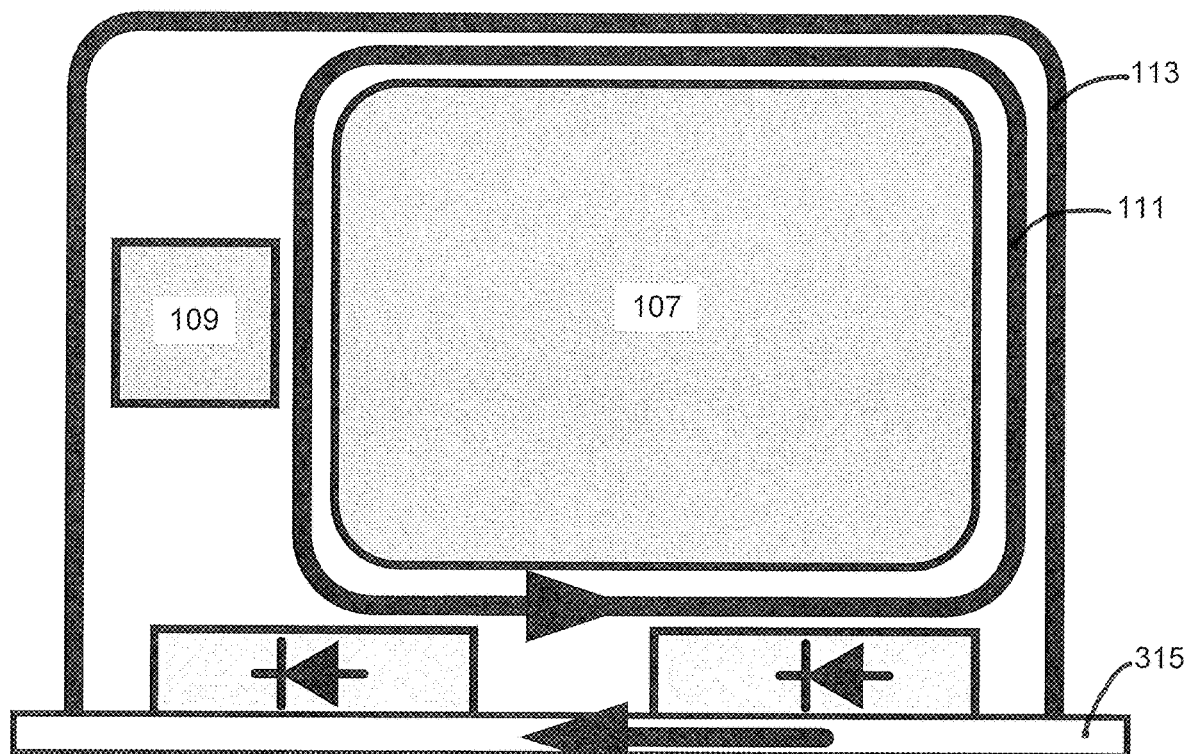
FIG. 10 illustrates an AC current flow relationship in accordance with an embodiment.

Referring to FIG. 10, illustrated is the AC current flow relationship between the high voltage winding 111 and the power semiconductor devices 301 connected to the low voltage winding 113. Since the winding currents flow in opposite directions, the flow of current will be distributed evenly across the power semiconductor devices connected in parallel. That is, because the embodiment provides parallel-connected power semiconductor devices 301 acting as a single conductor, the proximity effect causes the current to be evenly spread among those power semiconductor devices 301 when in close proximity to the high voltage winding.

Figure 11:
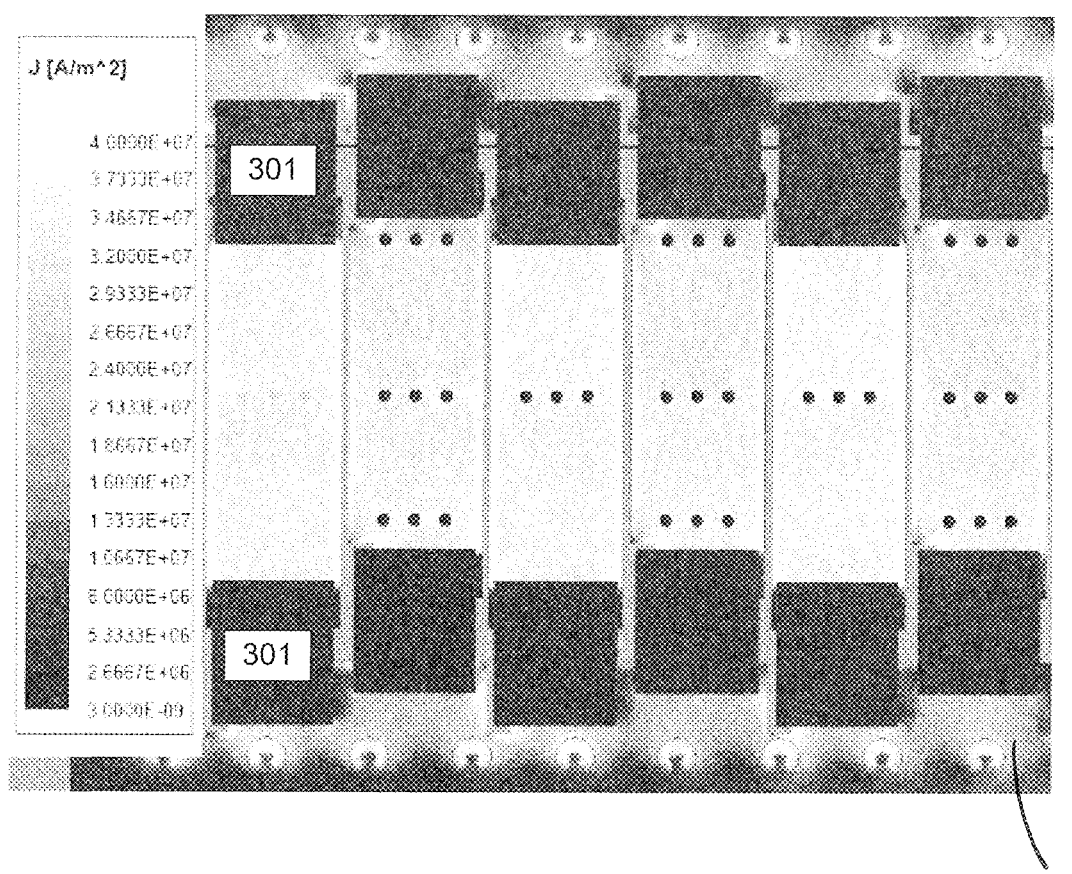
FIG. 11 illustrates the current density of parallel-connected FETs in accordance with an embodiment.

The result of the evenly spread current is illustrated in FIG. 11, which shows the current densities of parallel-connected FETs 301. This figure depicts only the FETs and interconnect in the printed wiring board 315. As illustrated, the current densities in the interconnect between the power devices connected in parallel are approximately equal. This is due to the impedance balancing and the proximity effect from the high voltage winding located immediately above the FETs.

Using the advantages above, the current capability of the power converter may be scaled to higher current levels by increasing the length of the transformer and increasing the number of FETs connected in parallel. Thus, even at very high switch frequencies, current may be evenly distributed among a large number of power semiconductor devices connected in parallel.

In further embodiments, such as when the transformer 101 is used in a lower power converter, the power semiconductor devices need not be arranged in a parallel configuration. Such embodiments still utilize the same basic mechanical configuration as disclosed herein, however, as it is advantageous for reducing AC losses in the printed wiring board or substrate 315, reducing AC losses in the low voltage winding 113, and for generating a large enough leakage inductance for use in a resonant DC/DC power converter.

Figure 12:
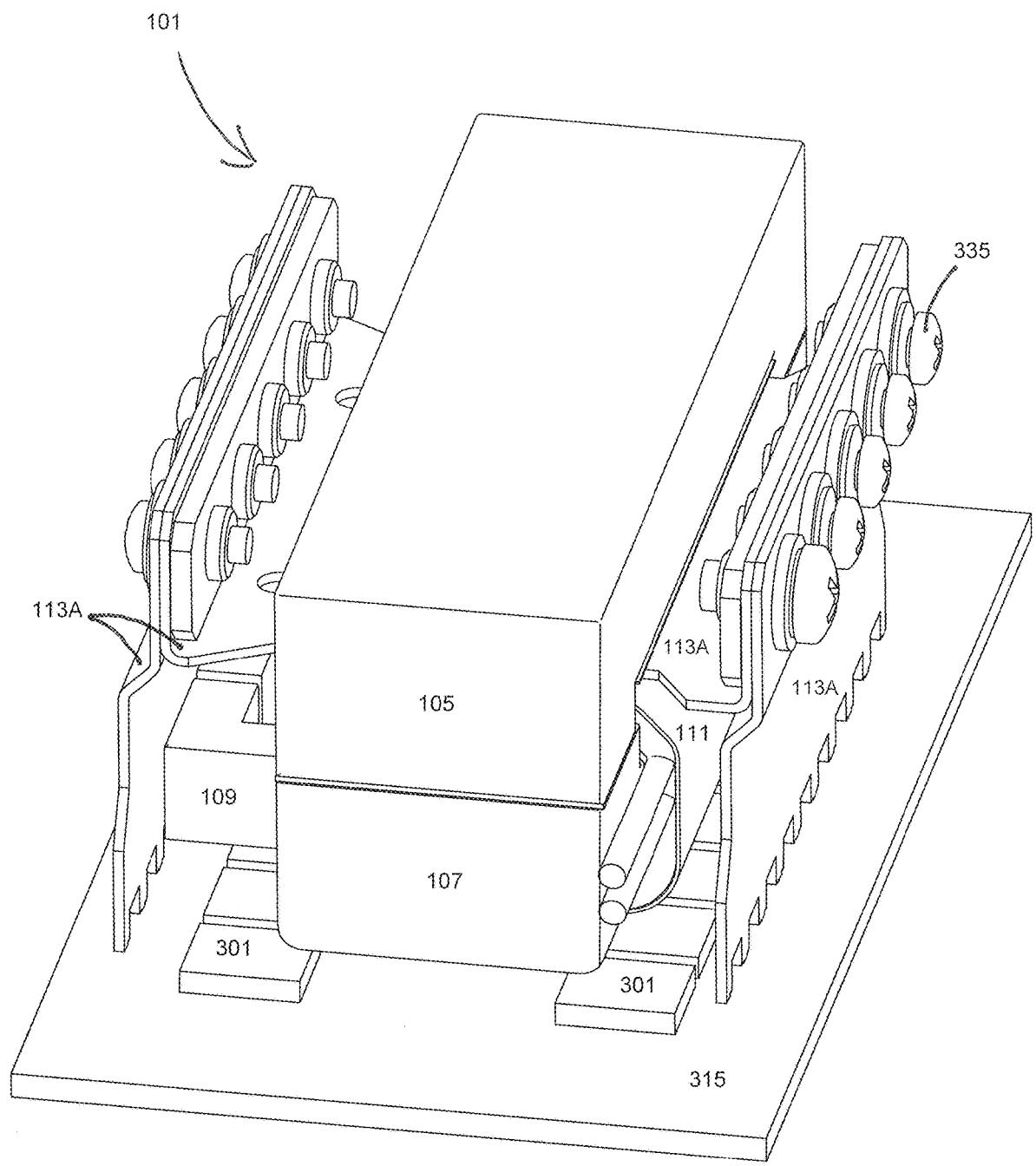
FIG. 12 illustrates another embodiment of the transformer, with detachable electrical connections.

FIG. 12 illustrates an additional embodiment, with the transformer being removable from the printed wiring board or direct bonded copper substrate (DBC) 315, without requiring removal of a soldered connection. As shown, the transformer may be electrically connected to the power semiconductor devices by using bolts or other types of fasteners 335 and a multi-part low voltage winding 113A.

A further advantage of the embodiments disclosed herein is that the power output capacity of the transformer device 101 is scalable to about 10,000 watts, while a conventional transformer with the same footprint can only output about 1,000 watts. This approximate ten-fold improvement in output power capacity results from the use of the balanced impedance output that yields an even distribution of current to all the power semiconductor devices 301 and a design that allows the transformer length to be increased and additional semiconductor devices to be added to increase current output capacity as required.

Although the disclosed subject matter has been described and illustrated with respect to the exemplary embodiments provided herein, it will be understood by those of ordinary skill in the art that various additions and modifications may be made to these disclosed embodiments without departing from the spirit and scope of the innovations disclosed herein, which are set forth in the following claims.

What is claimed is:

1. A transformer device comprising:
   a core having a top core, a bottom core, and a shunt core, the top core disposed above and mated to the bottom core, and the bottom core mated to the shunt core;
   a high voltage winding interposed between the top core and the bottom core and between the bottom core and the shunt core, the high voltage winding wrapping around the bottom core;
   a low voltage winding interposed between the top core and the bottom core, the low voltage winding encircling the bottom core, the high voltage winding, and the shunt core;
   a first low voltage winding terminal and a second low voltage winding terminal,
   a circuit board on which the first and second low voltage winding terminals are provided, the first and second low voltage winding terminals connected the low voltage winding to complete a turn of the encircling low voltage winding, the circuit board disposed below the bottom core and proximate to the high voltage winding; and
   a plurality of power semiconductor devices mounted on the circuit board and connected to the first and second low voltage winding terminals.

2. The transformer device of claim 1, wherein the first and second low voltage winding terminals have a length and a width, each length being significantly longer than the associated width.

3. The transformer device of claim 2, wherein the power semiconductor devices are arranged in two rows, at approximately equidistant spacing within each row, between the first and second low voltage winding terminals on the circuit board.

4. The transformer device of claim 3, wherein each power semiconductor device row extends to a length that is 75% to 125% of a width of the low voltage winding.

5. The transformer device of claim 4, where the power semiconductor devices mounted on the circuit board are disposed proximate to the high voltage winding.

6. The transformer device of claim 5, wherein the power semiconductor devices are disposed proximate to the high voltage winding at a distance of 0 to 0.25 times a width of the high voltage winding.

7. The transformer device of claim 6, wherein the power semiconductor devices are connected in a parallel configuration to the first and second low voltage winding terminals.

8. The transformer device of claim 1, wherein the circuit board is a printed wiring board or a direct copper bonded substrate.

9. The transformer device of claim 3, wherein the power semiconductor devices are disposed on a top side of the circuit board so as to face toward the transformer core.

10. The transformer device of claim 3, wherein the power semiconductor devices are disposed on an underside of the circuit board so as to face away from the transformer core.

11. The transformer device of claim 7, wherein the connected power semiconductor devices are configured to form a rectifying circuit.

12. The transformer device of claim 7, wherein the connected power semiconductor devices are configured to form a driving circuit.

13. The transformer device of claim 1, further comprising a transformer holder that maintains the relative positioning of the windings and cores.

14. The transformer device of claim 1, the shunt core comprising multiple core segments that are spaced apart from one another by at least one gap.

15. The transformer device of claim 1, the shunt core comprising a single core segment composed of a low permeability magnetic material, such as a powdered metal material.

16. The transformer device of claim 1, wherein the low voltage winding has a multi-part construction that removably connects the transformer device to the circuit board or substrate.

17. A method of distributing current among a plurality of power semiconductor devices connected to the low voltage winding of a transformer, comprising the steps of:
   providing a transformer device having a magnetic core, a low voltage winding, and a high voltage winding;
   mounting the power semiconductor devices on a circuit board provided with a pair of opposing elongated terminals, the power semiconductor devices arranged in two rows, at approximately equidistant spacing within each row, between the elongated terminals;
   connecting the power semiconductors to the elongated terminals;
   connecting the elongated terminals to the low voltage winding such that the power semiconductors complete a turn of the low voltage winding; and
   positioning the semiconductor devices in proximity to the high voltage winding.

18. The method of claim 17, further comprising the step of:

winding the high voltage winding to a width that is between 75% and 125% of a width of the low voltage winding.

\* \* \* \* \*